United States Patent
Todi et al.

(10) Patent No.: US 9,875,329 B1
(45) Date of Patent: Jan. 23, 2018

(54) METHOD AND SYSTEM FOR IMPORT OF MASK LAYOUT DATA TO A TARGET SYSTEM

(71) Applicant: CADENCE DESIGN SYSTEMS, INC., San Jose, CA (US)

(72) Inventors: Sunil Todi, Uttar Pradesh (IN); Amit Khurana, Chandigarh (IN); Chandra Manglani, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 77 days.

(21) Appl. No.: 14/983,288

(22) Filed: Dec. 29, 2015

(51) Int. Cl.
*G06F 17/50* (2006.01)

(52) U.S. Cl.
CPC ................ *G06F 17/5068* (2013.01)

(58) Field of Classification Search
CPC ...................................... G06F 17/50

USPC ........................................... 716/55
See application file for complete search history.

(56) References Cited

U.S. PATENT DOCUMENTS

2008/0005713 A1\* 1/2008 Singh .................. G06F 17/5045
                                                             716/102

\* cited by examiner

*Primary Examiner* — Thuan Do
(74) *Attorney, Agent, or Firm* — Eric L. Sophir; Dentons US LLP

(57) ABSTRACT

A host system for transferring data to a target system is provided. The host system may include a layout database for storing mask layout data representing an integrated circuit (IC) in terms of planar geometric shapes. The hosts system may further include a processor configured to import the mask layout data from the layout database to a memory-mapped disk in the host system. The processor is further configured to translate the mask layout data into one or more cell views according to a table hierarchy in the memory-mapped disk. The processor is further configured to transmit the one or more cell views from the memory-mapped disk to a magnetic disk of the target system.

20 Claims, 7 Drawing Sheets

FIG. 1 (Prior-Art)

FIG. 2 (Prior-Art)

METHOD AND SYSTEM FOR IMPORT OF MASK LAYOUT DATA TO A TARGET SYSTEM

TECHNICAL FIELD

This application generally relates to integrated circuit (IC) layouts, and in particular relates to methods and systems for faster import of mask layout data to a target system.

BACKGROUND

The process of fabricating integrated circuits typically involves a functional design step, followed by a physical design step. During the functional design step, a design concept is described using a hardware description language and is then converted into a netlist, which specifies the electronic components and the connections between the components. The physical design step specifies the placement of the electrical components or elements on the chip and routing of the connections between the electrical components and thereby implementing the netlist. The physical design process generates the physical design data, which are synonymously called layout data, target layout, or an IC mask layout.

The IC mask layout represents an IC in terms of planar geometric shapes, and in other words defines a set of binary patterns or objects, which are also called features or geometric features. Usually the objects are represented as a polygon or collection of polygons in the layout data in order to facilitate the specification of the objects. Each object can be a part of an electronic component, such as a gate of a transistor or a connection between components. Each polygon object has vertices and edges joining the vertices. Each vertex is usually defined by its coordinates in a Cartesian x-y coordinate system.

These planar geometric shapes correspond to the shapes actually drawn on photo masks used in semiconductor device fabrication. The IC layout may then be created by automatic electronic development automation (EDA) tools. By way of example, the EDA tools may include place and route tools, and schematically driven layout tools. The IC layout can also be created and edited manually by an IC designer.

The IC layout results in the representation of the IC in various IC mask layout data formats. By way of example, the IC mask layout data formats can be stored in a GDS database format, a MEBES database format, or an OASIS database format. These IC mask layout data formats involve a binary format for the representation of planar geometric shapes, text labels, and other information in a flat or hierarchical manner.

The layout data needs to be imported to a target system, where a customer can work on the data. FIG. 1 is a prior-art block diagram of importing layout data file from a host system to a target library in a target system according to presently available methods. As depicted in FIG. 1, the layout data files are stored in a layout database 102 in a GDS database format. The semiconductor design flows uses the mask layout data stored in the layout database 102 to exchange physical design information. The mask layout data is then transferred to a target disk location 104 in the target system, to reconstruct the design data as it is processed across different design tools 106 before finally handing over to foundries for fabrication.

The continuing advances in semiconductor fabrication technology, and the increasing demand for complex functionality in modern semiconductor chips has led to generation of an exponentially larger mask layout data, and therefore a large amount of data has to be transmitted to the target disk location in the target system. The typical mask layouts are taken through several exchanges across the design tools 106 for design transformations, such as design rule check (DRC) removal, LVL verification, chip-level integration, chip-finishing editing, and final verification at foundry. At each stage, a large-sized hierarchical layout needs to be imported into a corresponding design tool 106 and edited. This involves the translation of the mask layout data into the target library 104 supporting the hierarchical design.

The target system hierarchical databases like OpenAccess store different elements of hierarchy in individual directories and files. Hence, importing a typical mask layout for a hierarchical design needs the creation of directories and files in the order of millions. While the core translation process of converting layout information to target database objects is host system CPU intensive, creating the target disk location representation of the hierarchical design is highly I/O intensive. The network disk setups makes I/O slower depending on the network latency. Since multiple iterations of translation are required in the full design flow from the beginning of physical design to chip fabrication, the mask layout import ends up consuming a sizeable amount of the IC designer time.

As depicted in FIG. 2, each step involves a portion of host system CPU operation which makes a system call for the target disk access and logic execution. This is the reason the host system CPU and the target disk operations gets interleaved. In a normal scenario, the target disk is shared between several processes and users that make this flow very time consuming. This target disk sharing is time consuming because the target disk is assigned to other users/processes when the CPU operations are being executed, and is assigned back to the import process when the CPU needs to perform the disk access. The target disk sharing also increases the disk head movements. Therefore, the import of one cell view from the mask layout data has to go through these interleaved CPU and the target disk operations which tends to consume significant time.

Therefore, there is a need for methods and systems that addresses the above mentioned drawbacks of the conventional techniques employed for mask layout data import, and is thereby able to reduce translation time for large hierarchical layouts that leads to higher productivity.

SUMMARY

Methods and systems disclosed herein attempt to address the above issues and may provide a number of other features as well. Methods and systems described herein can provide a data transfer technique to transfer mask layout data between a host system and a target system using an intermediate memory-mapped disk that solves the above described drawbacks of the conventional techniques being employed to directly transmit the mask layout data between the host system and the target system. The present disclosure further uses a 'shadow' hierarchy on the memory-mapped disk as an intermediate translation target during layout data import. The layout data file is translated to this shadow hierarchy which is a copy of a target hierarchy of the target system, but with a substantially faster I/O storage access, and then moved with reduced need for I/O storage access to a final disk location in the target system. The memory-mapped disk may be a block of primary storage RAM interpreted by the host system as a disk drive. The memory-mapped disk may be volatile, and is substantially faster than hard disk drives. The present disclosure leverages the characteristics of the memory-mapped disk to achieve faster translation that is predictable and robust.

In one embodiment, a processor-implemented method for transmitting data from a host system to a target system. The method may include generating, by a processor of the host system, mask layout data representing an integrated circuit (IC) in terms of planar geometric shapes. The method may further include importing, by the processor of the host system, the mask layout data to a memory-mapped disk in the host system. The method may further include translating, by the processor of the host system, the mask layout data into one or more cell views according to a table hierarchy in the memory-mapped disk. The method may further include transmitting, by the processor of the host system, the one or more cell views from the memory-mapped disk to a magnetic disk of the target system.

In another embodiment, a host system for transmitting data to a target system is provided. The host system may include a layout database for storing mask layout data representing an integrated circuit (IC) in terms of planar geometric shapes. The hosts system may further include a processor configured to import the mask layout data from the layout database to a memory-mapped disk in the host system. The processor may further be configured to translate the mask layout data into one or more cell views according to a table hierarchy in the memory-mapped disk. The processor may further be configured to transmit the one or more cell views from the memory-mapped disk to a magnetic disk of the target system.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

Figure 1:
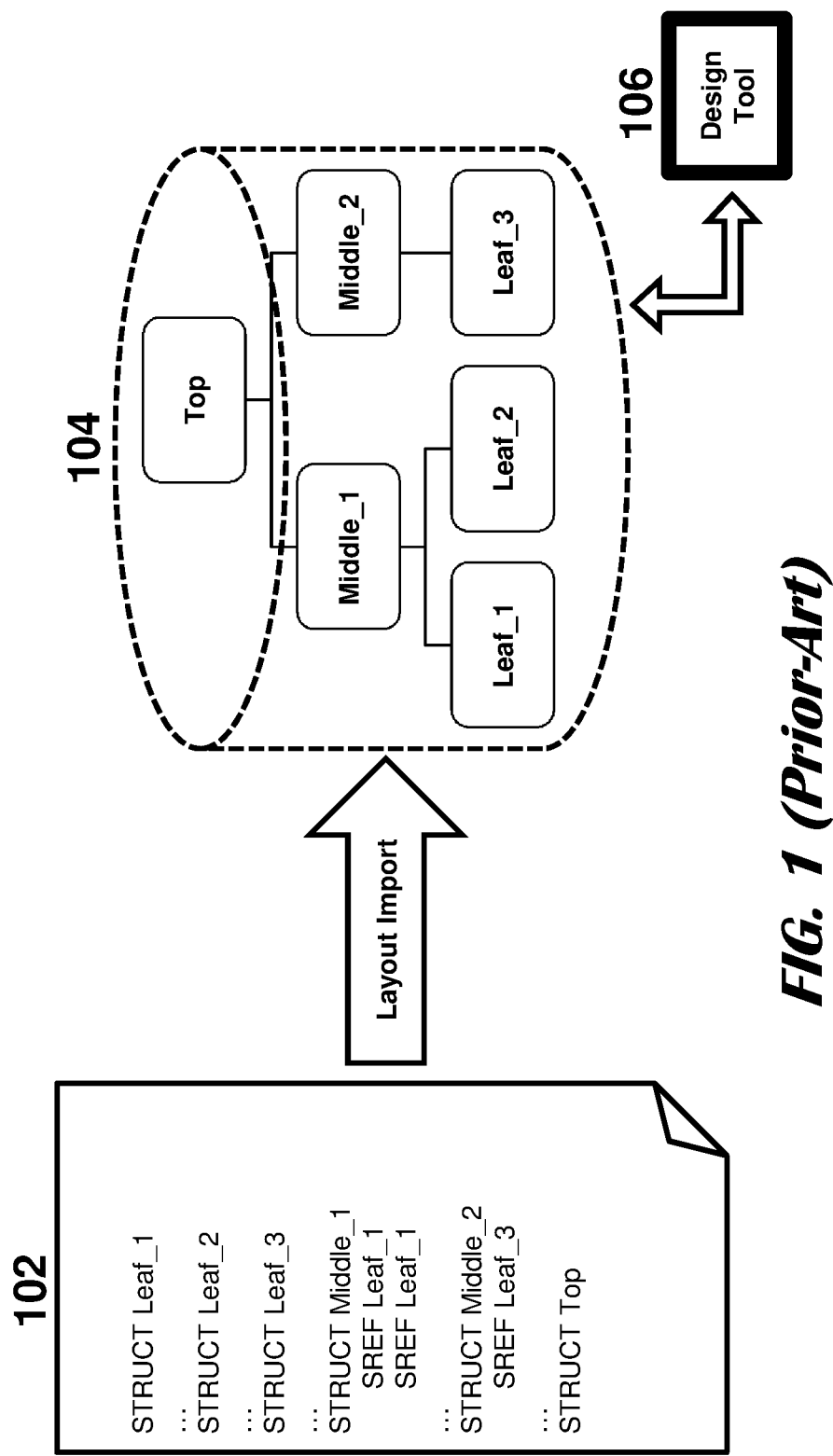
FIG. 1 is a prior-art block diagram of importing layout data file from a host system to a target library in a target system.
Figure 2:
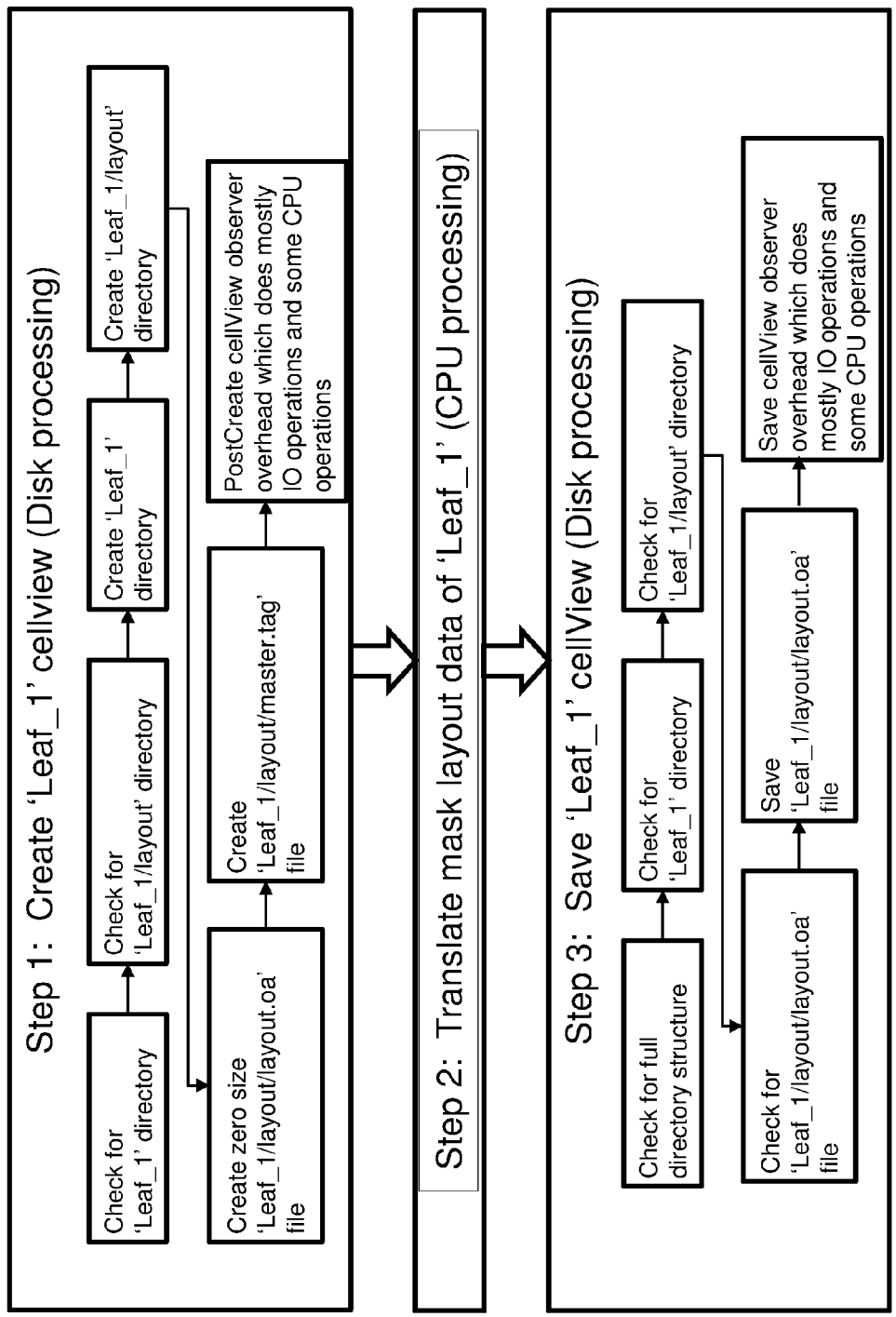
FIG. 2 is a prior-art flow diagram depicting stages of processing of data in transferring layout data file from a host system to a target library in a target system.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

One embodiment of a process provides for a data transfer technique in an emulation system to transfer mask layout data between a host system and a target system using an intermediate memory-mapped disk having a 'shadow' hierarchy as an intermediate translation target during layout data import. The intermediate translation in the memory-mapped disk reduces the overall translation time for large hierarchical mask layout data. The data transfer process operates as a multithread operation in which in a first thread, the layout data file is translated to the shadow hierarchy that is a partial or complete copy of a target hierarchy of the target system, but with a substantially faster I/O storage access, and in a second thread the translated data is moved with reduced need for I/O storage access to a final disk location in the target system. The configuration of the memory-mapped disk and the simultaneous operation of the two threads allows to achieve thirty five times (35×) faster translation time of the large hierarchical mask layout data and that leads to higher productivity of the overall emulation system.

Figure 3:
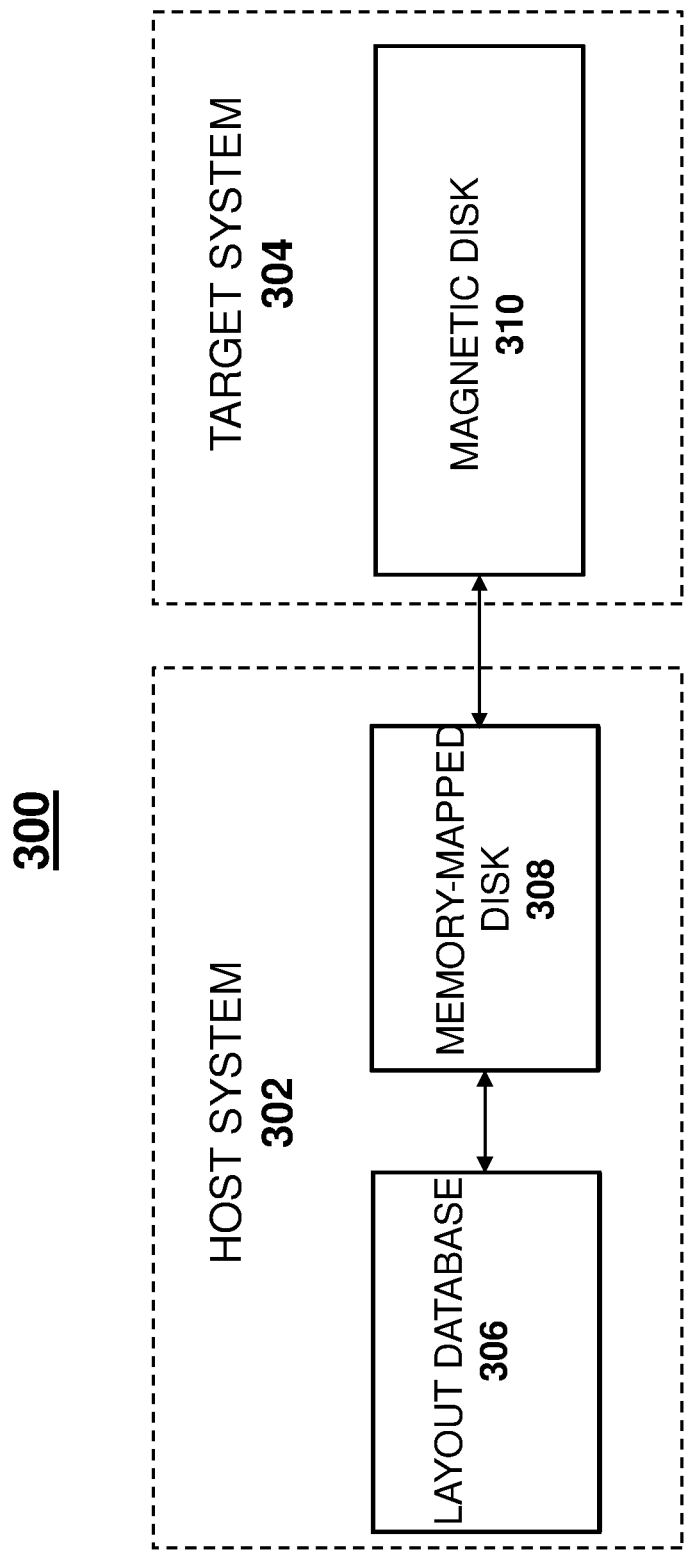
FIG. 3 illustrates an emulation system, according to an exemplary embodiment.

FIG. 3 illustrates an illustrative emulation system 300, according to an exemplary embodiment. The emulation system 300 may be a hardware emulation system and a simulation acceleration system, and are collectively referred to the emulation system 300 in the subsequent description. The emulation system 300 may include a host system 302 and a target system 304, emulation support facilities (not shown), and an emulation engine (not shown). The host system 302 may be coupled to the emulation support facilities. The emulation support facilities may include a workstation interface, program compilation, power sequencing, program loading and data capture. Under control of the host system 302, programming information and data may be loaded to the emulation engine from the support facilities. The host system 302 may allow a user to interface with the emulation engine, control the emulation process, and collect emulation results for analysis.

The host system 302 may be connected to the target system 304 via a network. The network refers to a medium that connects various computing devices and databases of the system 300. Examples of the network may include, but are not limited to, LAN, WLAN, MAN, WAN, and the Internet. Communications over the network may be performed in accordance with various communication protocols such as Transmission Control Protocol and Internet Protocol (TCP/IP), User Datagram Protocol (UDP), and IEEE communication protocols.

The host system 302 may be any computing device, and provides for a user interface. The computing device is a computer with a processor/microcontroller and/or any other electronic component that performs one or more operations according to one or more programming instructions. Examples of the computing device include, but are not limited to, a desktop computer, a laptop, a personal digital assistant (PDA), a tablet computer, or the like. The computing device is capable of communicating with the target system 304 through the network using wired or wireless communication capabilities.

The host system 302 may have access to a layout database 306. The layout database 306 stores various electronic circuit layouts, layout rules, and pattern libraries. The layout rules for the layouts may be derived from design rules of a fabrication process. The layout rules may include limitations on the design features that require adjustments to the features and shapes. In one example, the layout rules may include rules for the sizing and spacing of features such that compliance with the rules may require the addition, removal, or resizing of shapes. The layout rules may be defined using the SKILL language.

The host system 302 may also include a collection of tools that are accessible using the user interface, and various electronic circuit layout data formats including but not limited to a Graphic Database System ("GDS" or "GDSII") database format, a Manufacturing Electron Beam Exposure System (MEBES) database format, and an Open Artwork System Interchange Standard (OASIS) database format. The layout database 306 further provides a baseline to the electronic circuit layout design, and the electronic circuit layout design specifications for each of the formats such as the GDS format, the MEBES database format, and the OASIS database format are compared with the baseline. Consequently, there may be flow of information between layout editor tools and an electronic circuit layout data viewer that may result in a simultaneous display of the electronic circuit layout design in various electronic circuit layout data formats.

The host system 302 may execute the layout editor tools and access the layout database 306, which may reside on the host system 302 or on a separate computing device coupled to the host system 302. The host system 302 may be configured to execute the layout editor tool or otherwise facilitate access to the layout database 306 storing layouts and pattern libraries. In an alternate embodiment, multiple different host systems may access a server hosting a layout database via the network, and request access to the electronic circuit layouts stored therein. The server may be accessible to the host system 302 via the network. The user interface of the host system 302 may receive instructions regarding access to the electronic circuit layout design from an electronic circuit designer stored in the layout database of the server. The server may further include a layout editor tool that comprises a collection of tools. The layout editor tool may have access to the layout database of the server. The electronic circuit designer of the host system 302 uses the layout editor tool to work on editing of the electronic circuit design layout. The electronic circuit designer may interact with the layout editor tool through a number of input devices such as by inputting a selection as with a mouse or inputting a request as with a keyboard. The electronic circuit designer may observe the response to the access request on an output device or display.

The host system 302 further comprises a memory-mapped disk 308. In one embodiment, the memory-mapped disk 308 is a part of a memory of the host system 302. Some of the commonly known memory implementations may include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. The memory-mapped disk 308 may be formed during installation of an operation system, such as, but not limited to, Linux in the host system 302 by assigning a certain portion of the memory of the host system 302 as the memory-mapped disk 308. The memory-mapped disk 308 may store a shadow hierarchy for intermediate translation of the layout data. The shadow hierarchy may be a portion of or a copy of a final target hierarchy. In one example, the hierarchy of the layout may be structured as a tree, as understood in the art, where the leaves of a tree are attached to its branches. The branches may be attached to larger branches. The hierarchy of branches continues until the trunk of the tree reaches its roots. In another example, hierarchy of the layout may be formed by cells, where leaf cells of a circuit are cells that do not include any cells by reference. A leaf cell may include a set of objects, which are usually polygons. A child cell may be included in its parent cell. A root cell may not be included in any other cell. The layout can have multiple root cells resembling a forest with multiple trees, and cells can be referenced a number of times within a single parent cell or by multiple parent cells.

The emulation system 300 may include the target system 304. The target system 304 may be any computing device with a processor/microcontroller and/or any other electronic component that performs one or more operations according to one or more programming instructions. Examples of the computing device include, but are not limited to, a desktop computer, a laptop, a personal digital assistant (PDA), a tablet computer, or the like. The target system may include a disk (or a target disk), such as a magnetic disk 310, that stores a target hierarchy (or a table hierarchy). The table hierarchy may refer to a cell reference graph that is created in which hierarchical relationships between the various cells are identified. This reference graph identifies a top cell and the hierarchical ordering of lower level cells contained within the IC layout. All cells in the IC layout are identified in a group model register. A group model may be a collection of pointers to geometries in the shape model register and to other group models in the group model register. The lowest level cell components may be called shapes and are efficiently stored in the shape model register. In an alternate embodiment, the magnetic disk 310 storing the hierarchy may be a component of the host system 302.

The emulation system 300 described herein may be a hardware emulation system configured to capture and deliver emulation data to a simulator running on any host workstation without considerably sacrificing emulation speed or sacrificing the emulation capacity available for a user's hardware design. The emulation system 300 may include a hardware emulator that is a programmable device used in the verification of a hardware design. Prior to manufacture of an integrated circuit, designers generally verify the functionality of their designs, and the hardware emulator allows designers to verify that a design under test (DUT) will function in the target system 304, which logically represents a commercialized computing system in which the logic system (e.g., integrated circuit) being tested may eventually reside.

Figure 4:
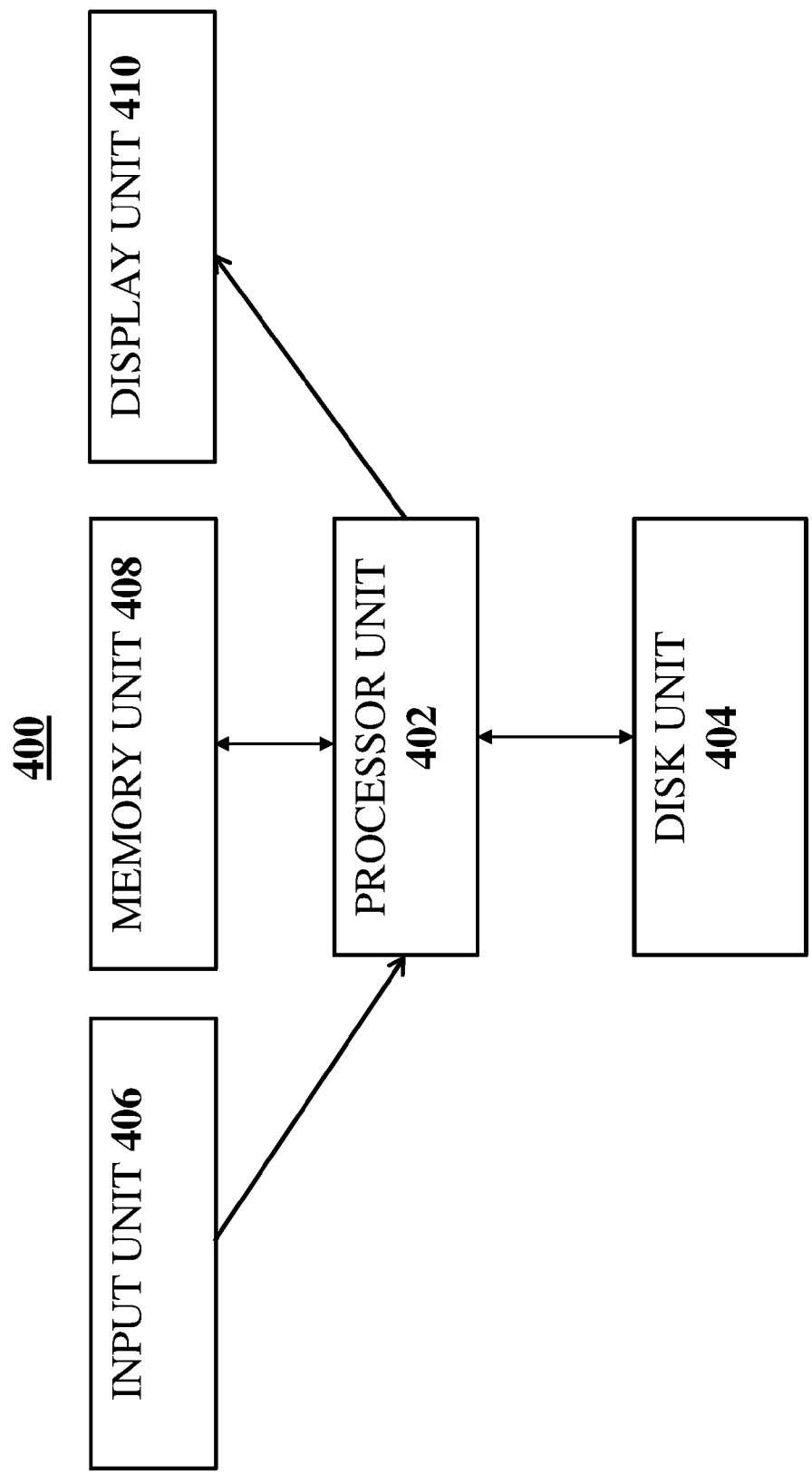
FIG. 4 illustrates a system used for importing layout data file to a target system, according to an exemplary embodiment.

FIG. 4 illustrates a system 400 used for importing layout data file to a target system 304, according to an exemplary embodiment. FIG. 4 will be explained in conjunction with the previously described figures. In one example, the system 400 may be a host system. In another example, the system 400 may be a target system. In yet another example, the system 400 may include the host system and the target system. The system 400 may include a processor unit 402, a disk unit 404, an input unit 406, a memory unit 408, and a display unit 410. In one implementation, all the components of system 400 may be connected via interconnect bus.

In another implementation, the processor unit 402 and the disk unit 404 may be connected via a local microprocessor bus, and the remaining units of the system 400 may be connected via one or more input/output buses.

The processor unit 402 implements a processor/microprocessor system to control the operations of the system 400. The processor unit 402 may include a single processor or a plurality of processors for configuring the system 400 as a multi-processor system. The processor unit 402 includes suitable logic, circuitry, and interfaces that are operable to execute one or more instructions to perform predetermined operations/tasks. The processor unit 402 can be realized through a number of processor technologies known in the art. The examples of the processor unit 402 may include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor.

The disk unit 404 may be a non-volatile storage device for storing electronic circuit layouts and instructions to be used by the processor unit 402. The disk unit 404 may be implemented with a magnetic disk drive, an optical disk drive, a solid state device, or an attachment to network storage. The disk unit 404 may include one or more memory devices to facilitate storage and manipulation of program code, set of instructions, tasks, data, PDKs, and the like. Some of the commonly known disk unit 404 implementations include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. Further, the disk unit 404 may include the one or more instructions that are executable by the processor(s) of the processor unit 402 to perform specific operations. It is apparent to a person having ordinary skills in the art that the one or more instructions stored in the disk unit 404 enable the processor unit 402 of the system 400 to perform the predetermined operations/tasks. The support circuits for the processor unit 402 include conventional cache, power supplies, clock circuits, data registers, I/O interfaces, or the like. The I/O interface may be directly coupled to the disk unit 404 or coupled through the processor of the processor unit 402.

The input unit 406 may be a keyboard, mouse, pointer, or other input generating device to facilitate input of control instructions by the integrated circuit designer to the processor unit 402. In one embodiment, the input unit 406 provides a portion of the user interface for the system 400, and may include an alphanumeric keypad for inputting alphanumeric and other key information along with a cursor control device, such as a mouse, a track pad or stylus.

The memory unit 408 of the system 400 may store the software to load the software to the disk unit 404. The memory unit 408 of the system 400 may also store instructions to be used by processor unit 402 to allow the electronic circuit designer access to the electronic circuit layouts for viewing, editing, or maybe both. The display unit 410 of the system 400 may include a cathode ray tube (CRT) display, liquid crystal display (LCD), plasma, or active matrix organic light emitting diode display. In one embodiment, a graphics subsystem may receive textual and graphical information, and processes the information for output to the display unit 410. In another embodiment, the electronic circuit layouts may be accessed by the electronic circuit designer by way of a graphical user interface or layout editor visualized by the display unit 410. The display unit 410 may also visualize a graphical user interface or the layout editor having a design mode and an edit mode to enable generation an editing of custom electronic circuit designs.

Figure 5:
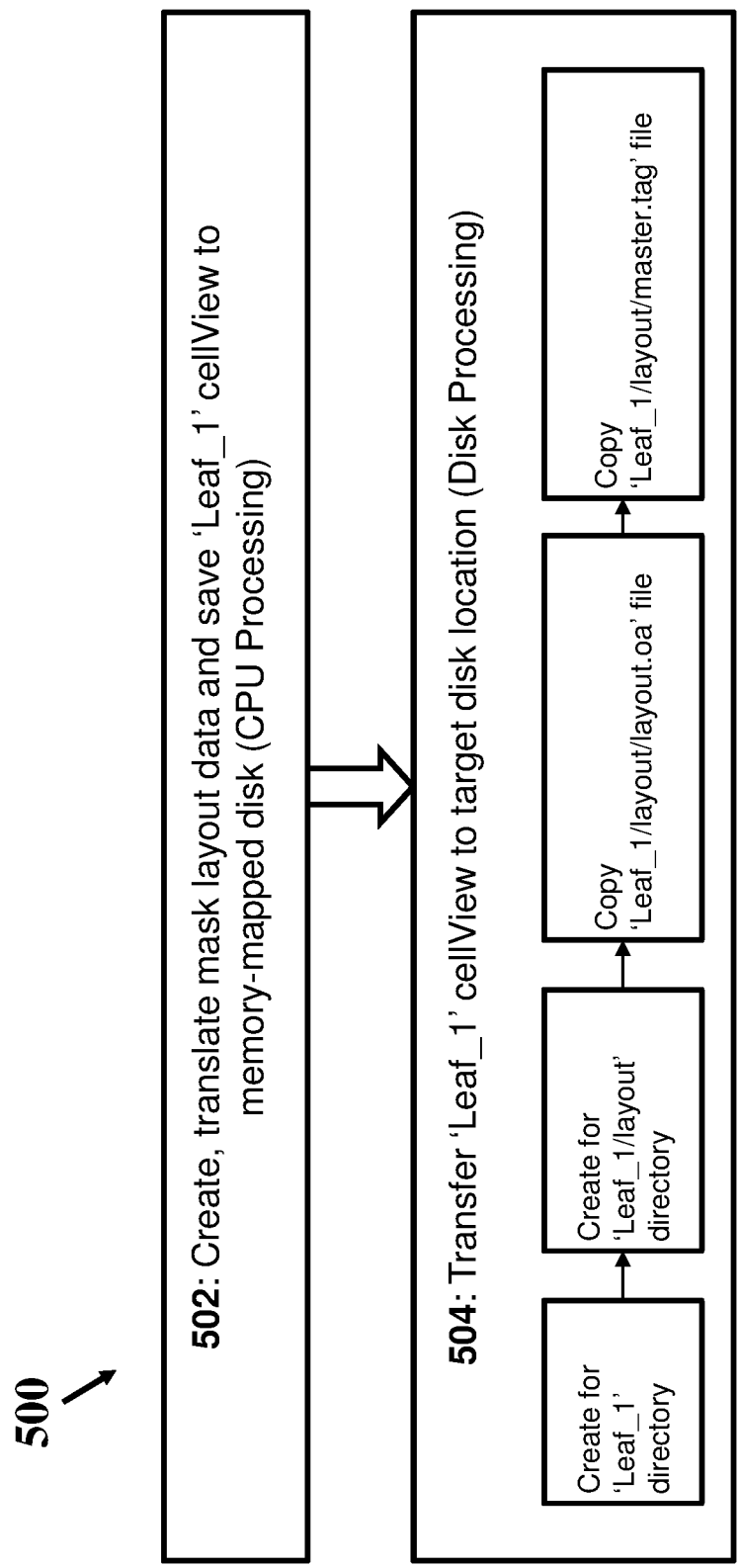
FIG. 5 depicts stages of processing of data in importing layout data file from a host system to a target disk in a target system, according to an exemplary embodiment.

FIG. 5 is an illustrative process 500 that depicts stages of processing of data in transferring layout data file from a host system to a target disk in a target system, according to an exemplary embodiment. FIG. 5 is explained in conjunction with the previously described figures. At step 502, initially mask layout data is created at the host system by utilizing a processor of the host system. The process of fabricating integrated circuits involves a functional design step, followed by a physical design step. During the functional design step, a design concept may be described using a hardware description language and is then converted into a netlist, which specifies the electronic components and the connections between the components. The physical design step specifies the placement of the electrical components or elements on the chip and routing of the connections between the electrical components to implement the netlist. The physical design process creates/generates the physical design data called as layout data.

The layout data may define a set of binary patterns or objects, which are also called "features" or "geometric features." The objects may be represented as a polygon or collection of polygons in the layout data in order to facilitate the specification of the objects. Each object may be a part of an electronic component such as a gate of a transistor or a connection between components. Each polygon object may have vertices and edges joining the vertices, and each vertex may be defined by its coordinates in a Cartesian x-y coordinate system. The layout data may be stored and transmitted in a machine-readable format. For example, the layout data may be stored in a GDS-II stream formatted file. GDS-II is a file format classified as a data interchange format, and used for transferring mask-design data between the IC design and the fabrication facility.

After creating the mask layout data that contains data layers that correspond to the actual layers to be fabricated in the circuit, the mask layout data is translated utilizing the processor of the host system, and then saved in a memory-mapped disk of the host system. The mask layout data is translated by the processor of the host system into cells that define sets of particular devices within the IC circuit. The cells may contain all the polygons on all the layers required for the fabrication of the devices the cells contain. The cells may also be nested within other cells, often in very intricate arrangements. The structure of cells may be called a data hierarchy.

The symbolic cell representation that contains only primitive symbols, such as transistors, wires, capacitors and other physical components may be termed a leaf cell. The connections between cells are made with ports, and may be called pins. The leaf cells may contain rigid geometrical features that define their physical shape, such as definite distances between the ports of the cell.

The layout data may contain a large number of groups of components that are substantially identical. Such a group may be used to define a cell, and the description of the layout data may then be simplified by treating each such group as an instance of this cell. The cell may have its own symbol, for example it may be represented as a rectangle with various ports for connecting wires or for abutment with ports of adjacent cells that are represented similarly. The components of the overall layout data then may include of the many cells, and the layout data represents the relative placement and interconnection of the many cells.

The process of grouping elements and cells may be repeated so that a symbolic layout data can be treated as a hierarchical structure with multiple levels. Each level may be a symbolic layout data of various cells and primitive components. Each such cell in a level may be in turn a symbolic layout data of subcells and primitive components, and the layout data defines the next lower level of the hierarchy. There may be more than one type of cell at any given level, and the next lower level may contain several different branches. The cells at the lowest level may be the leaf cells since the leaf cells contain no subcells, but only primitive components. The cells at any other level are hierarchical cells. The hierarchy can be visualized as an inverted tree with branches extending downward, and the lowest level depends on the branch in which it is located. In one example, the leaf cells may be located at the ends of the branches, and the trunk of the tree represents the symbolic layout data of the whole chip. In another example, the term cell can refer to a lowest level component or leaf-level component of the design hierarchy, that is, a component that does not include further sub-components, or can refer to a component at intermediate levels of the hierarchy, that is, a component that does include further cells of its own.

As described above, the layout data is translated into cell views by the processor, and stored in the memory-mapped disk of the host system in hierarchical formats (shadow hierarchical formats), where parent cells can incorporate multiple child cells by referencing those cells. In one embodiment, the hierarchy of the cells may be defined based on a shadow hierarchical/hierarchy table stored in the memory-mapped disk. The shadow hierarchy table may be a portion of a hierarchical/hierarchy table stored in a target library of a target system. In another embodiment, the hierarchy of the cells may be defined based on a shadow hierarchical table that may be a same copy of the hierarchical table stored in the target library of the target system.

The hierarchy table may be defined in a number of ways. In one example, the hierarchical table may describe instances of cells where the top-most cell of the tree fully describes the layout of the device by containing layout geometry and/or by referencing child cells that describe or reference other geometry. The hierarchical table may be derived from an attribute file that is in turn derived from a high level descriptive. The hierarchical table establishes a parent-child relationship between cells together with information regarding the location and orientation of the cells on the integrated circuit substrate.

In another example, a designer can specify various property rules governing what types of checks wants to be performed at different levels of the design hierarchy using property groups of the visualization tool, and thereby creating the hierarchical table based on the various property rules. In yet another example, a table-based modeling may be utilized in which a designer who is simulating a circuit topology can take advantage of the speed of table-based device models for a particular part of the design hierarchy, and can use more physically accurate models for a different part of the design hierarchy when using a circuit simulation tool. The rule based system such as the visualization tool allows the designer to indicate which sub-hierarchies of the designs are to be associated with table-models. The visualization tool may present the circuit design in different forms of tables, such as block table, component table, and tree display. In block table display, the visualization tool may display a table of all the blocks in a design. In the component table, the visualization tool may display a table with a row for each component in a selected block. In the tree display, the visualization tool may display a node for each component in the entire design. In some embodiments, each block table, component table and node of a tree display may be associated with a row of data entry, and the entry fields allow the designer to enter property values/rules at varying hierarchical levels of the design.

At step 504, the cell views (leaf, hierarchical, or other cell views) saved in the memory-mapped disk are transmitted to the target disk in the target system. In another embodiment, the target disk may be a component of the host system. This step does not use the processor of the host system, but rather uses the disk processing. In one embodiment, once all the cell views are saved in the memory-mapped disk, the cell views are transmitted together to the target disk in the target system. In another embodiment, as soon as the cells are created and saved in the memory-mapped disk, the cells are transmitted to the target disk in the target system. In yet another embodiment, once all the cell views are saved in the memory-mapped disk, the cell views are transmitted together to the target disk in the host system.

Figure 6:
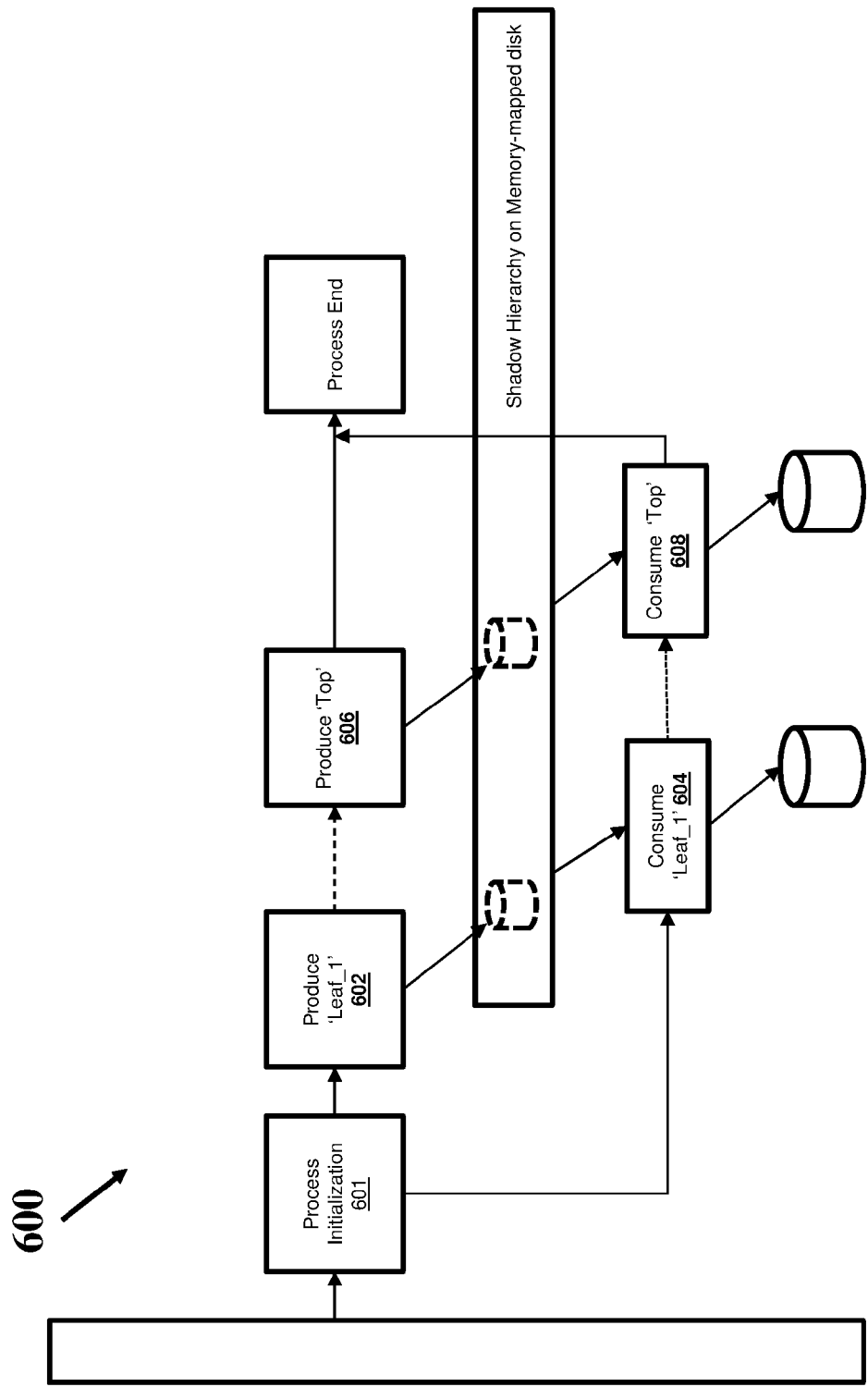
FIG. 6 is a block diagram depicting import of data from layout data file to a target disk in a target system, according to an exemplary embodiment.

FIG. 6 is a block diagram depicting an illustrative process 600 import of data from layout data file to a target disk in a target system, according to an exemplary embodiment. FIG. 6 is explained in conjunction with the previously described figures. The process initialization starts at step 601, and two threads are created. A first thread is for processor (CPU) operations of a host system which involves importing a cell view currently stored in a memory-mapped disk of the host system. In general, the first thread is a producer thread, which creates data layouts, translates the data layouts into cell views and saves the cell views in the memory-mapped disk of the host system based on a shadow hierarchy that may be a portion of or a copy of a final target hierarchy. The first thread stops producing more cell views if there is not enough space available in the memory-mapped disk of the host system, and the first thread may resume producing remaining cell views once space is available in the memory-mapped disk of the host system.

A second thread is for disk operations of the target system that involves writing the cell views to the target disk of the target system. The second thread is a consumer thread which consumes cell views from the memory-mapped disk, and write the cell views to the target disk of the target system. The second thread stops consuming the cell views if there are no cell views left to consume. The second thread resumes consuming cell views if the producer has produced more cell views, or otherwise the second thread terminates and joins to the main thread if there are no more cell views to be consumed.

In the example illustrated in the FIG. 6, the producer thread creates, translates and saves cells views, for example, leaf one cell view 602 in the memory-mapped disk. The consumer thread then fetches the leaf one cell view 602 into consume leaf location 604 in the magnetic disk (target disk), which may be located at the customer location. In one embodiment, a shadow table hierarchy may be created inside the memory-mapped disk by the producer. The consumer consumes the cell views from the shadow table hierarchy of the memory-mapped disk, and then the cell views may be transmitted to the magnet disk location of the user in accordance with its target table hierarchy, which is same as the shadow table hierarchy. In the illustrated example, the producer produces the leaf cell view in the memory-mapped disk, and the consumer consumes the produced leaf cell view in the target disk. This goes on for all the leaf cell views of the layout being created by the producer thread, for example leaf two, leaf three, middle one, middle two, and then at the last the producer thread produces a top cell 606. The consumer thread consume all the previously generated cell views on the memory-mapped disk one by one, and finally consumes or fetches the top cell 606 to consume top location 608 in the magnetic disk (target disk), which is located at the customer location, and the process 600 then ends. In this illustrated example, the two operating threads (producer thread and consumer thread) are completely segregated, that is, the processor (CPU) operation of the host system and the disk operation of the target system respectively, and thus the two threads are operated in parallel.

In the illustrated example, a target library is created in a current directory on the target disk, where the cell views are going to be saved at the end. A temporary library may be created in the memory-mapped disk of the host system. The temporary library may be mapped to the actual target library, and the translation of layout data into hierarchical cell views is performed at the memory-mapped disk, and the cell views are stored in accordance to the temporary library, and then subsequently transmitted to the target disk and stored in accordance to the target library which is mapped to the temporary library.

Figure 7:
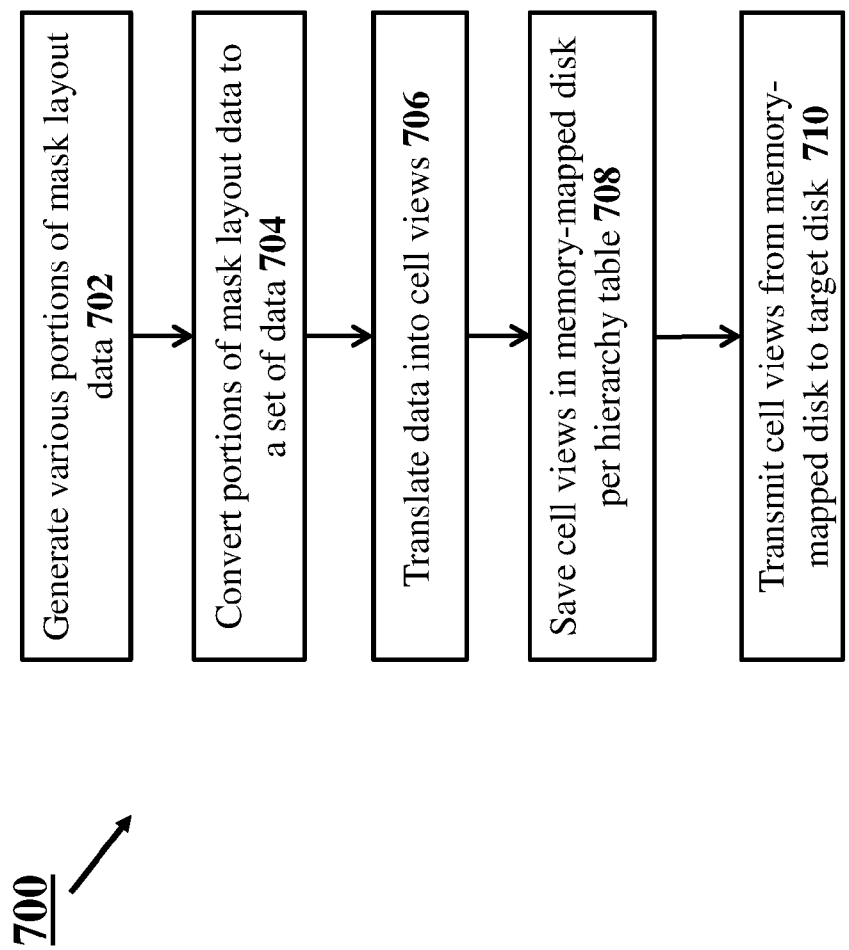
FIG. 7 is a flow diagram depicting import of layout data file from a host system being to a target disk in a target system, according to an exemplary embodiment.

FIG. 7 is a flow diagram of an illustrative process 700 depicting import of layout data file from a host system to a target disk in a target system, according to an exemplary embodiment. The method of the present disclosure generates a layout data file in GDS format that can be downloaded to the target system (customer's local computer) for verification, including test structures, circuit, with a generic layout viewer. In the design area, the customer may be given access to information and tools related to the design of their product, and the tools may enable the customer to perform enhancement analyses, view and modify layout information. By doing this, the customer is able to detect potential issues or problems, such as test structure issues, circuit structure issues at a very early stage of the design.

At step 702, various portions of a mask layout of an integrated circuit (IC) may be generated using mask layout data according to a predefined specification of the IC. In one embodiment, a customer provides the IC for manufacture. The process may start by generating an electronic file of the design layout in a stream data format such as GDS format. The design layout GDS file may be checked by a design rule check tool to ensure the design layout complies with various design rules. The design layout GDS file that represents the IC in terms of planar geometric shapes may be stored in a mask layout database located at a host system. The mask layout database may also store other design data that exists in many separate files including physical, logical, and various functional data that may be unique to the individual design tool being used. In the illustrated example, the physical design is stored in a GDS stream formatted file, which is classified as a "data interchange format," used for transferring mask-design data between the IC design and the fabrication facility. It is understood that other types of file formats, such as a MEBES database format, and/or an OASIS database format, may be also be used without moving out from the scope of the disclosed embodiments. These layout formats involve the binary format for the representation of the planar geometric shapes, text labels, and other information in a flat or hierarchical manner.

At step 704, a subset of the various portions of the mask layout is converted into a set of mask data in an electronic format, such as GDS format, prior to integrating the various portions of the mask layout. The process continues with an assembly process. The circuit design may be partitioned into various blocks, where each block performs a specific function. The various blocks are assembled together and the entire design layout (or IC layout) is ready for mask processing. The IC layout, also referred to as an IC mask layout, is a final representation of the IC in terms of planar geometric shapes. Such shapes correspond to the shapes actually drawn on photo masks that are used in semiconductor device fabrication.

At step 706, translate mask layout data into cell views. The mask layout data is processed by a processor of a host system and translated into the cell views. The cells are defined as either a geometric primitive, such as a single polygon, or as a combination of a plurality of primitives arranged to create a device, such as a transistor or a number of transistors. The cells are respectively used in the design of an integrated device, and it is convenient to identify each cell with a symbolic name that is easily manipulated on a computer. Each instance of this symbolic descriptor used in a circuit is then assembled into a sequence and format suitable for eventual output to a semiconductor processing equipment. The sequential stream of symbolic descriptors are typically stored in a memory-mapped disk of a host system and manipulated by computer-based processes to determine where each cell is to be placed on the integrated circuit and the interconnection between the cells. In an embodiment, for each cell view created, two directory and two files are also created.

At step 708, the cell views are saved by the processor in the memory-mapped disk of the host system in hierarchical formats where parent cells can incorporate multiple child cells by referencing those cells. In these formats on the memory-mapped disks, the cell views are described hierarchically as it helps reduce file sizes and improving efficiency for certain changes, since some patterns may be placed multiple times. Also in the layout hierarchy, a cell may be a subset of the layout pattern that can be referenced as a whole object, and thus the cells may be included in the layout by reference. In one example, the cell views are stored based on a table hierarchy (also called a shadow hierarchical table), which is a portion of target hierarchy (also called a target hierarchical table). In another example, the cell views may be stored based on a shadow hierarchical table, which is the same as the target hierarchical table. The cell views from the memory-mapped disk are then transmitted into the target disk at step 710, and saved in the target disk in accordance with the target hierarchical table.

In an embodiment, the processor of the host system determines whether there is space available in the memory-mapped disk of the host system to transmit the cell views. When the processor determines that the memory-mapped disk does not have enough space available to transmit the cell views, the processor transmits all of the cell views directly into the magnetic disk of the target system. In addition to determination of the availability of space, the processor may further determine whether a host administrator has permission to access the memory-mapped disk to request transmission of the cell views into the memory-mapped disk. When the processor determines that the host administrator does not have permission to access to the memory-mapped disk, then the processor may transmit all of the cell views directly into the magnetic disk of the target system.

In another embodiment, when the processor of the host system determines that the memory-mapped disk of the host system has sufficient space available to transmit the cell views, the processor transmits the cell views into the memory-mapped disk. In addition to determination of the availability of space, the processor may further determine whether a host administrator has permission to access the memory-mapped disk to request transmission of the cell views into the memory-mapped disk. When the processor determines that the host administrator has permission to access to the memory-mapped disk, then the processor transmits all of the cell views into the memory-mapped disk of the host system.

In yet another embodiment, if the processor of the host system determines that the memory-mapped disk of the host system has no further space available to save the cell views during the translation, the processor stops the creation of the cell views and/or transmission of the cell views into the memory-mapped disk. The processor may continue to determine the availability of the space in the memory-mapped disk, and when the memory-mapped disk has space available, the processor may resume the creation of the cell views and/or transmission of the cell views into the memory-mapped disk.

In yet another embodiment, when the processor determines a given cell view in the cell views has a size that cannot be accommodated by the memory-mapped disk of the host system, even though there is space available in the memory-mapped disk for the cell views of other sizes, then the processor transmits the given cell view directly into the magnetic disk of the target system and transmits other cell views into the memory-mapped disk.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A processor-implemented method for transmitting data from a host system to a target system, the method comprising:

creating, by a processor of the host system, mask layout data representing an integrated circuit (IC) in terms of planar geometric shapes;

during a first thread of operation executed by the processor of the host system:

importing, by the processor of the host system, the mask layout data to a memory-mapped disk in the host system, wherein the importing comprises translating by the processor of the host system the mask layout data into one or more cell views according to a table hierarchy in the memory-mapped disk, wherein the cell views hierarchically represent layout components in the IC; and during a second thread of operation executed by the processor of the host system in parallel to the first thread of operation:

transmitting, by the processor of the host system, the one or more cell views from the memory-mapped disk to a disk of the target system such that the one or more cell views are stored in the disk of the target system according to the table hierarchy in the memory-mapped disk of the host system.

2. The processor-implemented method of claim 1, wherein the mask layout data is stored in a machine readable format in a layout database.

3. The processor-implemented method of claim 1, wherein the disk of the target system is a magnetic disk, and wherein the magnetic disk stores a hierarchical database.

4. The processor-implemented method of claim 1, wherein the translating further comprises creating, by the processor of the host system, the one or more cell views.

5. The processor-implemented method of claim 4, further comprising determining, by the processor of the host system, availability of space in the memory-mapped disk to transmit the one or more cell views, wherein the processor is configured to transmit the one or more cell views into the memory-mapped disk when space is available.

6. The processor-implemented method of claim 5, wherein during the transmission of the one or more cell views into the memory-mapped disk, the processor stops the creation and the transmission of the one or more cell views into the memory-mapped disk when there is no further space available in the memory-mapped disk for the one or more cell views, and wherein the processor resumes the creation and the transmission of the one or more cell views into the memory-mapped disk when the space is available in the memory-mapped disk for the one or more cell views.

7. The processor-implemented method of claim 4, further comprising creating, by the processor of the host system, two directory and two files for each created cell view of the one or more cell views.

8. The processor-implemented method of claim 1, wherein the translating further comprises saving, by the processor of the host system, the one or more cell views in the memory-mapped disk.

9. The processor-implemented method of claim 1, wherein the table hierarchy in the memory-mapped disk is the same as a target hierarchy in the magnetic disk in the target system.

10. The processor-implemented method of claim 1, wherein the processor of the host system is configured to transmit a cell view of the one or more cell views directly into the disk of the target system when the memory-mapped disk cannot accommodate the cell view of the one or more cell views due to insufficient space for the cell view while continuing to transmit one or more cell views into the memory-mapped disk.

11. A host system for transmitting data to a target system, the host system comprising:

a layout database for storing mask layout data representing an integrated circuit (IC) in terms of planar geometric shapes; and a processor configured to:

execute a first thread of operation to:

import the mask layout data from the layout database to a memory-mapped disk in the host system;

translate the mask layout data into one or more cell views according to a table hierarchy in the memory-mapped disk, wherein the cell views hierarchically represent layout components in the IC; and execute a second thread of operation in parallel to the first thread of operation to:

transmit the one or more cell views from the memory-mapped disk to a magnetic disk of the target system such that the one or more cell views are stored in the magnetic disk of the target system according to the table hierarchy in the memory-mapped disk of the host system.

12. The system of claim 11, wherein the mask layout data is stored in a machine readable format in a layout database.

13. The system of claim 11, wherein the processor is configured to create the one or more cell views.

14. The system of claim 13, wherein the processor is configured to determine availability of space in the memory-mapped disk to transmit the one or more cell views, and wherein the processor is configured to transmit the one or more cell views into the memory-mapped disk when the space is available.

15. The system of claim 14, wherein during the transmission of the one or more cell views into the memory-mapped disk, the processor stops the creation and the transmission of the one or more cell views into the memory-mapped disk when there is no space available for the one or more cell views in the memory-mapped disk.

16. The system of claim 15, wherein the processor is configured to resume the creation and the transmission of the one or more cell views into the memory-mapped disk when space is available for the one or more cell views in the memory-mapped disk.

17. The system of claim 11, wherein the processor is configured to create two directory and two files for each created cell view of the one or more cell views.

18. The system of claim 11, wherein the magnetic disk stores a hierarchical database.

19. The system of claim 11, wherein the table hierarchy in the memory-mapped disk is the same as a target hierarchy in the magnetic disk in the target system.

20. The system of claim 11, wherein the processor is configured to transmit a cell view of the one or more cell views directly into the disk of the target system when the memory-mapped disk cannot accommodate the cell view due to insufficient space for the cell view while continuing to transmit one or more cell views into the memory-mapped disk.

* * * * *